US007002216B2

(12) United States Patent
Huang

(10) Patent No.: US 7,002,216 B2
(45) Date of Patent: Feb. 21, 2006

(54) ESD PERFORMANCE USING SEPARATE DIODE GROUPS

(75) Inventor: Shao-Chang Huang, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 10/863,435

(22) Filed: Jun. 8, 2004

(65) Prior Publication Data

US 2005/0269659 A1 Dec. 8, 2005

(51) Int. Cl.
*H01L 23/60* (2006.01)

(52) U.S. Cl. ...................................... 257/355; 257/363

(58) Field of Classification Search ................ 257/355, 257/356, 363

See application file for complete search history.

(56) References Cited

U.S. PATENT DOCUMENTS

| | | | | |
|---|---|---|---|---|
| 4,037,140 | A * | 7/1977 | Eaton, Jr. | 361/56 |
| 5,290,724 | A * | 3/1994 | Leach | 438/234 |
| 5,610,790 | A | 3/1997 | Staab et al. | |
| 5,708,550 | A | 1/1998 | Avery | |
| 6,002,568 | A | 12/1999 | Ker et al. | |
| 6,249,410 | B1 | 6/2001 | Ker et al. | |
| 6,671,147 | B1 * | 12/2003 | Ker et al. | 361/56 |
| 6,671,153 | B1 | 12/2003 | Ker et al. | |
| 6,674,622 | B1 | 1/2004 | Yu et al. | |

* cited by examiner

*Primary Examiner*—Gene M. Munson
(74) *Attorney, Agent, or Firm*—Baker & McKenzie LLP

(57) ABSTRACT

Disclosed are architectures and method for semiconductor ESD protection using grouped diodes, with the diode groups being electrically separated by substrate resistance. The mixed diode/resistor groups are arranged to be in an off state under normal operating conditions and to discharge ESD current between power lines. The disclosed architectures and method protects circuits using different power supplies and/or voltage inputs.

15 Claims, 6 Drawing Sheets

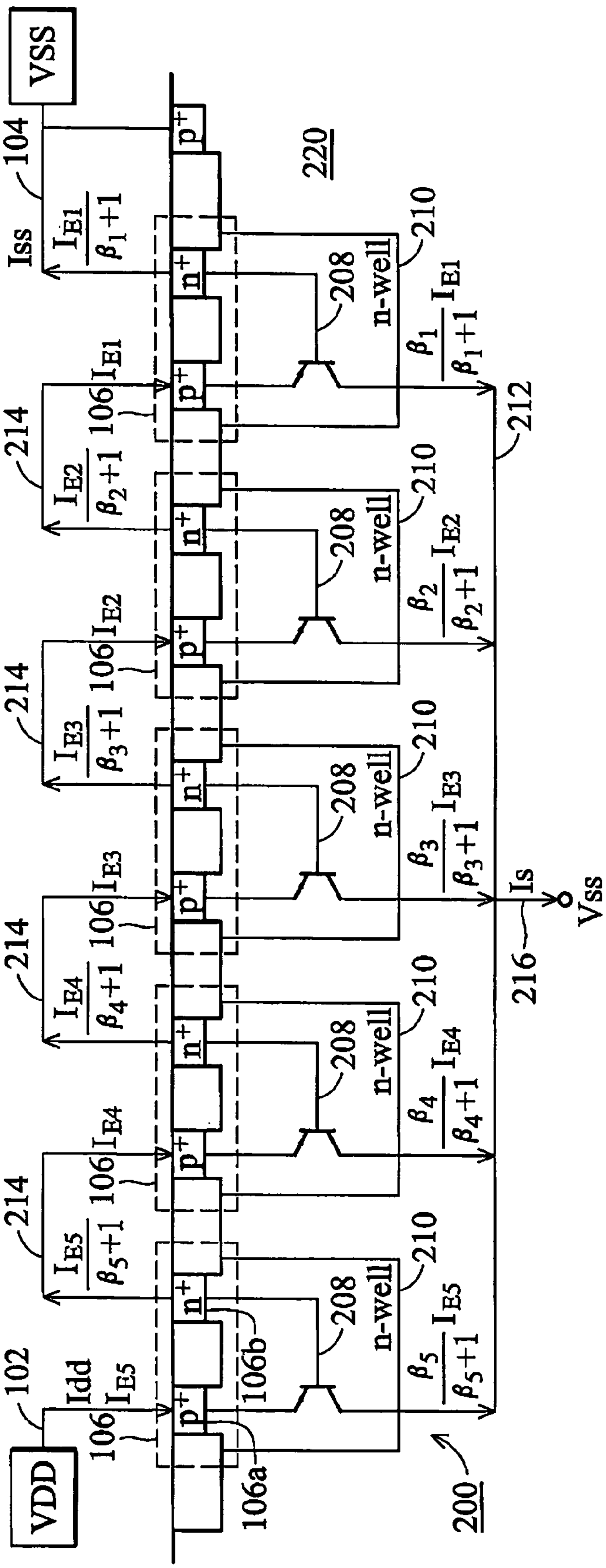

$$Is=\frac{\beta_5}{\beta_5+1}I_{E5}+\frac{\beta_4}{\beta_4+1}I_{E4}+\frac{\beta_3}{\beta_3+1}I_{E3}+\frac{\beta_2}{\beta_2+1}I_{E2}+\frac{\beta_1}{\beta_1+1}I_{E1}$$

$$=\left(\frac{\beta_5}{\beta_5+1}+\frac{\beta_4}{\beta_4+1}\times\frac{1}{\beta_5+1}+\frac{\beta_3}{\beta_3+1}\times\frac{1}{\beta_4+1}\times\frac{1}{\beta_5+1}+\frac{\beta_2}{\beta_2+1}\times\frac{1}{\beta_3+1}\times\frac{1}{\beta_4+1}\times\frac{1}{\beta_5+1}+\frac{\beta_1}{\beta_1+1}\times\frac{1}{\beta_2+1}\times\frac{1}{\beta_3+1}\times\frac{1}{\beta_4+1}\times\frac{1}{\beta_5+1}\right)I_{E5}$$

$$Idd=(\beta_1+1)(\beta_2+1)(\beta_3+1)(\beta_4+1)(\beta_5+1)Iss$$

FIG. 2 (RELATED ART)

ESD PERFORMANCE USING SEPARATE DIODE GROUPS

TECHNICAL FIELD

Disclosed embodiments herein relate generally to the field of electrostatic discharge ("ESD") protection circuits, and more specifically to ESD protection schemes using diode protection circuits.

BACKGROUND

Reliability in semiconductor circuits is an important aspect to chip design, especially with the increasing complexity of the circuits and the increased density of the silicon on which the circuits reside. Connections to inputs, outputs, and power are susceptible to ESD events that can damage internal components. Fundamentally, ESD is a short discharge of electric energy caused by the sudden release of an electrostatic build-up of electrical charge. If ESD currents flow suddenly through electronic components, the high currents can literally melt the carefully formed layers of an Integrated Circuit ("IC") device.

Modern semiconductor devices have increasingly small features and complex circuits having many additional interface pins and may further comprise multiple power pins and even multiple voltage levels, all of which further increase the susceptibility of the circuits to ESD events.

Circuits of IC devices are typically very susceptible to damage if ESD events cause input voltages that are outside of the power supply lines for the circuits. ESD protection circuits therefore have often included diodes to shunt such outlying input voltages back to the power supply circuits, which accordingly prevents high currents from flowing through what would otherwise be improperly biased transistors and other circuit elements in the ICs. For example, a simple diode having its anode at a signal input and its cathode at a positive power supply voltage or "rail" will conduct current once the input has exceeded the power supply voltage rail by the diode's turn-on voltage, which in a typical PN junction is approximately 0.7 volts. Relative to the ground supply voltage, that same input might have the cathode of another diode at the input and the anode of the diode at the ground supply rail, in which case the diode will begin to conduct if the signal input falls below the ground supply rail by more than the diode's turn-on voltage.

During normal circuit operation, when the signal inputs are within the power supply rail voltages, the diodes are off and ideally have no effect on the circuit operation. To further ensure that the ESD protection diodes have no effect during normal circuit operation, it is often desirable to provide diode circuits having higher turn-on voltages relative to the supply rails. In a series connection of discrete (i.e., non-IC) diodes, the diode turn-on voltages are additive, such that two diodes in series will have a turn-on voltage of approximately 1.4 volts. In a practical implementation using integrated circuit or transistor diodes, however, the stacking of PN junctions form parasitic bipolar transistors. The parasitic transistors allow current to sink to the substrate, which increases leakage current; and, due to this leakage current, the addition of diodes does not necessarily linearly increase the turn-on voltage from the diode string. The result is that still more diodes are needed to support an increased voltage.

SUMMARY OF THE SYSTEM AND METHOD

An improved diode protection circuit is used to provide a low-cost method to protect a semiconductor device from ESD events. An additional advantage includes the ability to provide additional voltage configurations while maintaining a low leakage current.

In diode protection circuits, a number of diodes are stacked together in a series diode string to provide the proper turn-on voltage. This protection method at a circuit input will dissipate voltages that are potentially harmful by configuring the diode string to conduct when voltages events occur that are outside of the power supply range. A single PN-junction silicon diode will provide a turn-on voltage of 0.7 V. Multiple diodes are used in series to provide a higher turn-on voltage. A drawback in previous methods is that the junctions that are formed by multiple diodes increase the leakage current and place a corresponding undesired current drain on the power supply. To overcome this shortcoming, protection circuits have evolved into increasingly complicated schemes, which use more valuable silicon space resulting in an increased product cost.

The protection methods shown in this disclosure provide voltage protection in a simple diode string using a method to isolate adjacent PN-junction pairs and reduce the leakage current. In the disclosed method, sufficient ESD protection is provided in a cost-effective solution, and no additional processes are required.

BRIEF DESCRIPTION OF THE DRAWINGS

For a more complete understanding of the present invention, and the advantages thereof, reference is now made to the following descriptions taken in conjunction with the accompanying drawings, in which:

FIG. 2 illustrates a conventional ESD cross sectional circuit diagram comprising a series of diodes in an integrated circuit application;

DETAILED DESCRIPTION OF THE PREFERRED EMBODIMENTS

Figure 1:
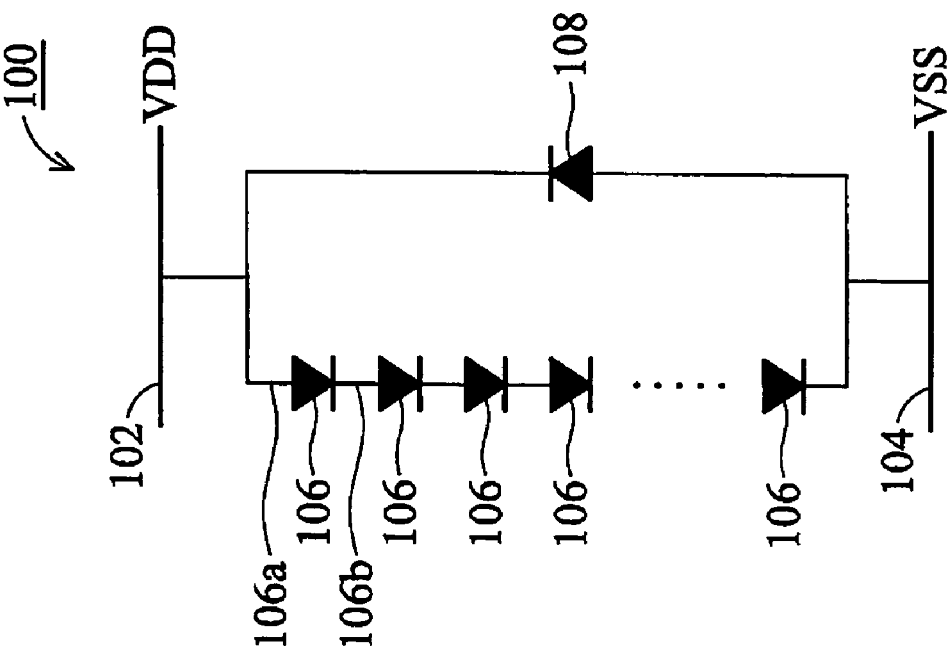
FIG. 1 illustrates a conventional ESD protection circuit protecting the two supply rails of an integrated circuit relative to each other.

FIG. 1 is a schematic diagram of a typical diode-based ESD-protection circuit 100. The goal of an ESD-protection circuit of this kind is to prevent either negatively inverted or excessively high voltages from being applied to the power supply rails 102, 104 of an integrated circuit. Accordingly, the series diode connections 106 are stacked in order to begin conducting current once the voltage on VDD has exceeded VSS by a certain amount above which the internal circuitry components could be damaged.

Each of the series diodes 106 includes a first terminal 106A and a second terminal 106B. In a standard discrete component design, the turn-on voltages of each of the series-connected diodes is added to yield the overall turn-on voltage. The turn-on voltage is the voltage at which the series components will begin to conduct electricity. For example, the turn-on voltage of a single forward-biased PN junction diode is often approximated as 0.7 volts.

In reality, the current-voltage (I-V) of a diode is plotted as a curve showing the current flow relative to increasing voltage. When the forward-biased diode voltage reaches 0.7 volts, then the I-V curve has reached its knee, and the current begins to flow in a much more increasing relationship to the applied voltage. As an approximation, however, the I-V characteristic of a diode is ideally represented by a step function where it begins to conduct completely at the turn-on voltage of approximately 0.7 volts. For this approximation, if two diodes are placed in series, the turn-on voltage of that diode string will be approximately 1.4 volts. More generally, a string of these diodes will, in an idealized model, have a turn-on voltage of 0.7×N, where N is the number of series-connected diodes.

Diode 108 of FIG. 1 is also provided to keep a negative voltage from being applied across the voltage supply rails, which is an event that could otherwise occur in the case of an ESD. As shown in the figure, the diode 108 will begin to conduct once the VSS voltage exceeds the VDD voltage by a single turn-on voltage.

Thus, with the above-described circuit, the power supply rails to the conventional circuit are protected both from correctly biased voltages that are too high, and from reversed-biased voltages being applied to the supply rails. Similar approaches can be used to protect signal and address pins (generically, "I/O" pins) and other voltage supply pins. As mentioned, the diode circuits of FIG. 1 represent idealized models in which each diode is completely isolated from the other except by their connected terminals. Integrated circuit implementations, however, have all of the diodes formed essentially as transistor diodes on a common substrate with each diode being formed in a "well" of a first impurity type that in turn is formed in a substrate of a second, opposite impurity type.

FIG. 2 provides a circuit diagram in cross-sectional view of a five-diode series string 200 formed in an integrated circuit implementation. As in FIG. 1, this figure illustrate a series group of diodes connecting the positive and ground supply rails 102, 104. In each instance, the diode 106 also has a first terminal 106A and second terminal 106B. In the present example, the first terminal 106A is the P junction of the PN-junction diode. The second terminal 106B is the N junction of the PN-junction terminal. The diode 106 is formed in an active region 210, which in the present example is an N-well 210. The difficulty in this design is that the N-well active regions as shown here create a parasitic bipolar transistor 208. Because of the leakage currents that are attendant to the parasitic PNP transistors, the turn-on voltage created by the series combination of these elements can be significantly reduced. The total leakage current to the substrate, $I_S$, and the corresponding supply current needed, $I_{dd}$, are illustrated in Equation 1, shown below $$Is = \frac{\beta_5}{\beta_5+1}I_{E5} + \frac{\beta_4}{\beta_4+1}I_{E4} + \frac{\beta_3}{\beta_3+1}I_{E3} + \frac{\beta_2}{\beta_2+1}I_{E2} + \frac{\beta_1}{\beta_1+1}I_{E1} \qquad \text{Equation 1A}$$

$$Is = \left(\frac{\beta_5}{\beta_5+1} + \frac{\beta_4}{\beta_4+1}\cdot\frac{1}{\beta_5+1} + \frac{\beta_3}{\beta_3+1}\cdot\frac{1}{\beta_4+1}\cdot\frac{1}{\beta_5+1} + \frac{\beta_2}{\beta_2+1}\cdot\frac{1}{\beta_3+1}\cdot\frac{1}{\beta_4+1}\cdot\frac{1}{\beta_5+1} + \frac{\beta_1}{\beta_1+1}\cdot\frac{1}{\beta_2+1}\cdot\frac{1}{\beta_3+1}\cdot\frac{1}{\beta_4+1}\cdot\frac{1}{\beta_5+1}\right)I_{E5}$$

$$Idd = (\beta_1+1)\cdot(\beta_2+1)\cdot(\beta_3+1)\cdot(\beta_4+1)\cdot(\beta_5+1)Iss \qquad \text{Equation 1B}$$

As illustrated in FIG. 2, because of the close proximity of the active areas 210, the currents are all allowed to flow freely from the source to provide current to all of the other parasitic transistors. In this example, if the $I_{ss}$ current is decreased, according to equation 1B above, the $I_{dd}$ current will be decreased as well. That is because in this equation, all of the currents ultimately reference back to the $I_{E5}$ current as shown in Equation 1A. And through substitutions, an overall current is calculated for $I_{dd}$ that is based on a multiplication of the Betas ("βs") of each of the parasitic PNP transistors.

Figure 3:
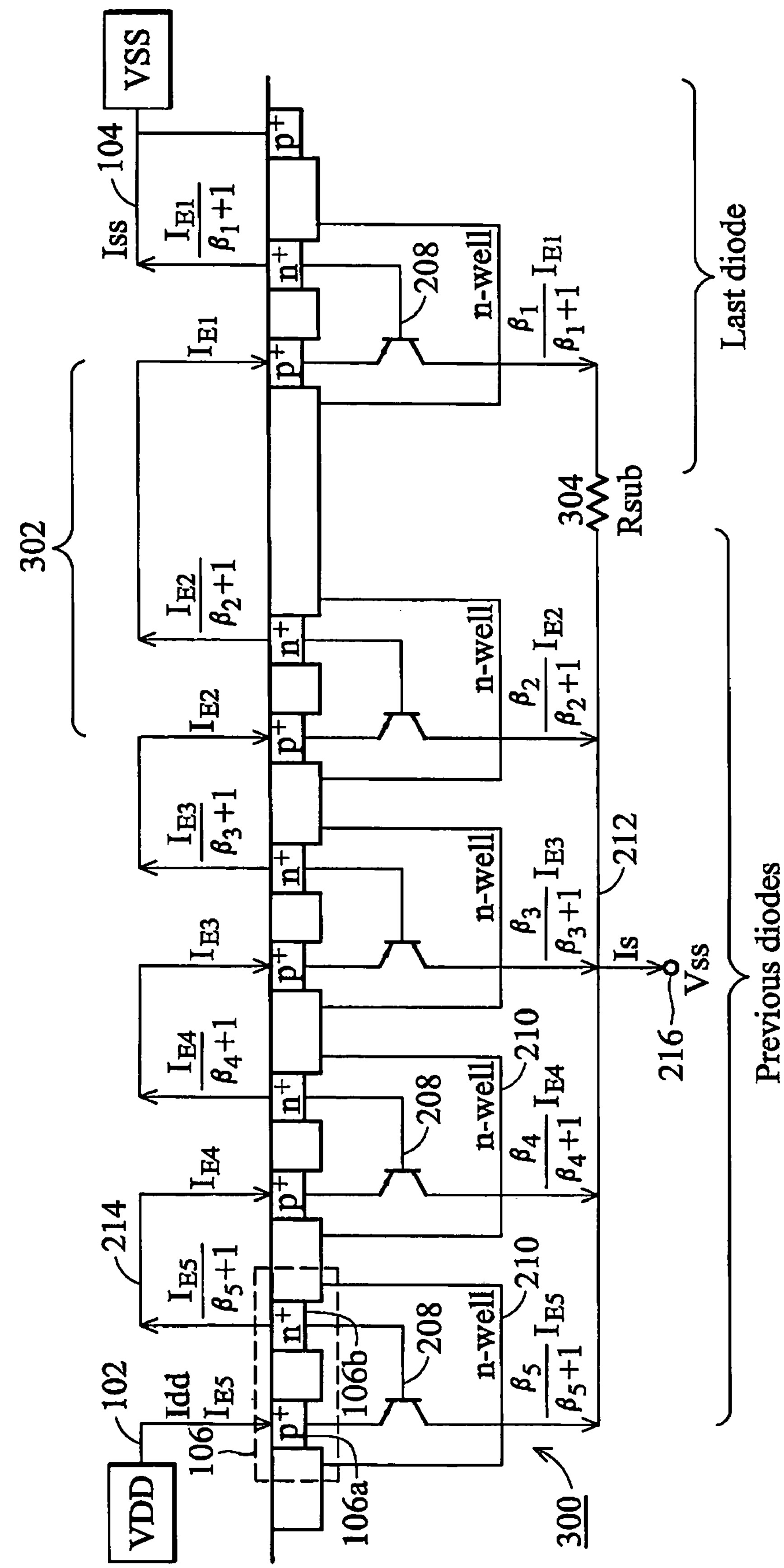
FIG. 3 illustrates a cross-sectional circuit diagram illustrating a proposed architecture for forming a group of series diodes for ESD protection in which the last diode in the series is physically and/or electrically separated from the preceding diodes.

FIG. 3 shows one exemplary embodiment in which the final diode 106 is electrically and physically separated from the group of other series diodes 106 by a portion of the semiconductor substrate 302, which acts as a substrate resistor $R_{sub\ 304}$. In other words, the substrate resistor $R_{sub\ 304}$ serves to isolate the final transistor diode, comprising the diode 106 and the parasitic PNP transistor 208, from the previous transistor diodes 106/208. This is in contrast to the approach of FIG. 2 in which the collectors of all of the parasitic PNP transistors 208 are tied to a common voltage, and in which because of the multiplicative effect of the base current of each parasitic PNP transistor 208 being driven by the emitter current of the adjacent parasitic PNP transistor 208, the collector (and approximately emitter, assuming β>>1) current in each adjacent to the right transistor diode 106/208 must be approximately β times (again, assuming β>>1) the current through the collector of the left-adjacent transistor diode 106/208.

In the described embodiment, because of the $R_{sub\ 304}$, all of the collectors of the transistor diodes 106/208 are no longer tied together, and the Vdrop across $R_{sub\ 304}$ will drive up the collector voltage of the fourth transistor diode 106/208. By doing this, the voltage required to turn on the fourth transistor diode 106/208 and all the other "upstream" transistor diodes will be substantially increased, and for a given applied voltage, the leakage current will be substantially decreased.

Figure 4:
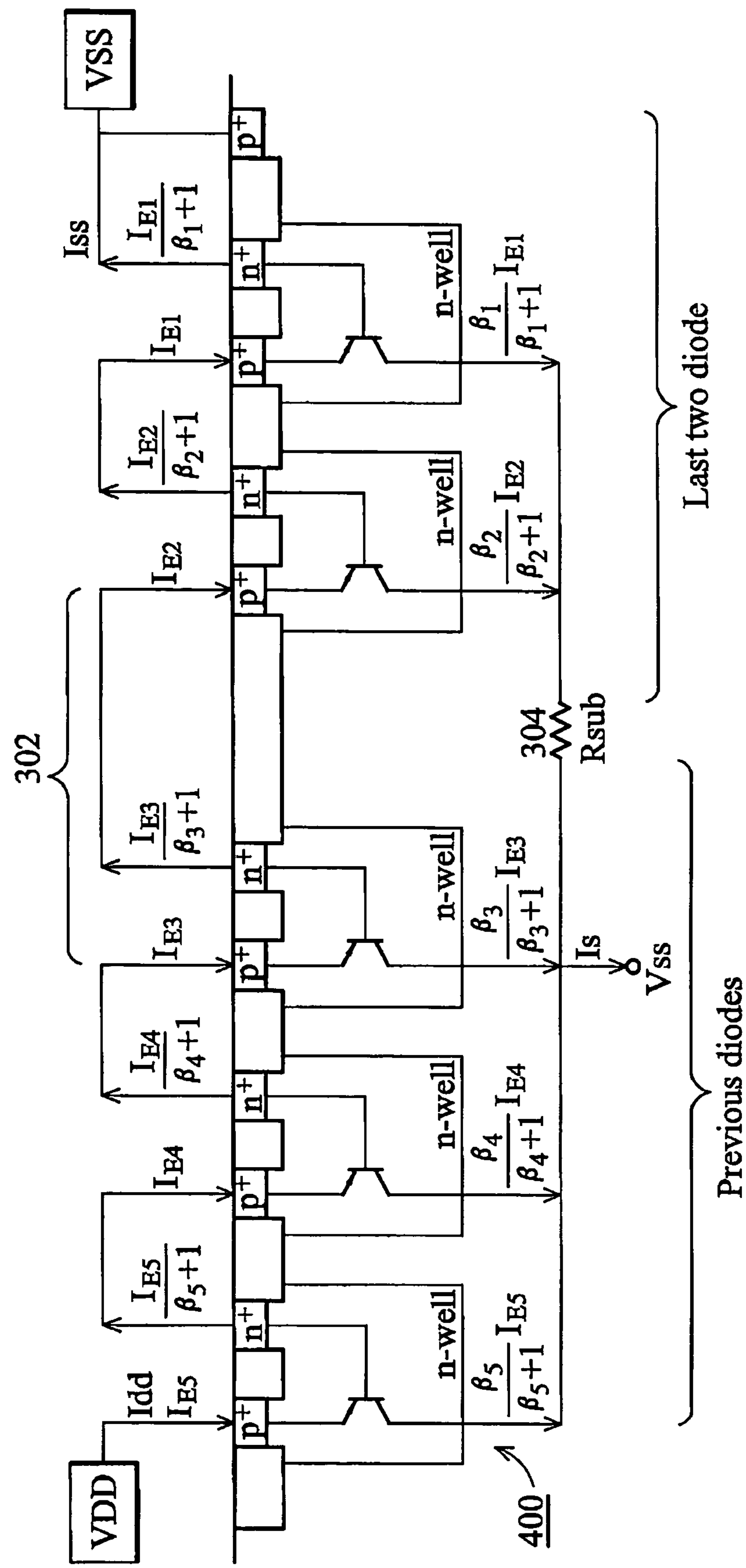
FIG. 4 illustrates an ESD protection circuit similar to the one on FIG. 3, but using a group of two diodes that is separated from the remaining previous diodes.

FIG. 4 shows that it may also be desirable to break up a diode string into groups multiple diodes each. Specifically in FIG. 4, the last two diodes are this time isolated from the other previous diodes due to the spacing between their respective active areas, which results in the $R_{sub}$ 304. In certain embodiments, it may be desirable to separate the group of two diodes together, thereby allowing for the increased turn-on voltage from the series combination of diodes while still not incurring the substantial leakage penalty and amplification of leakage currents such as described above for the situation in which five or more parasitic transistors are linked in parallel.

Figure 5:
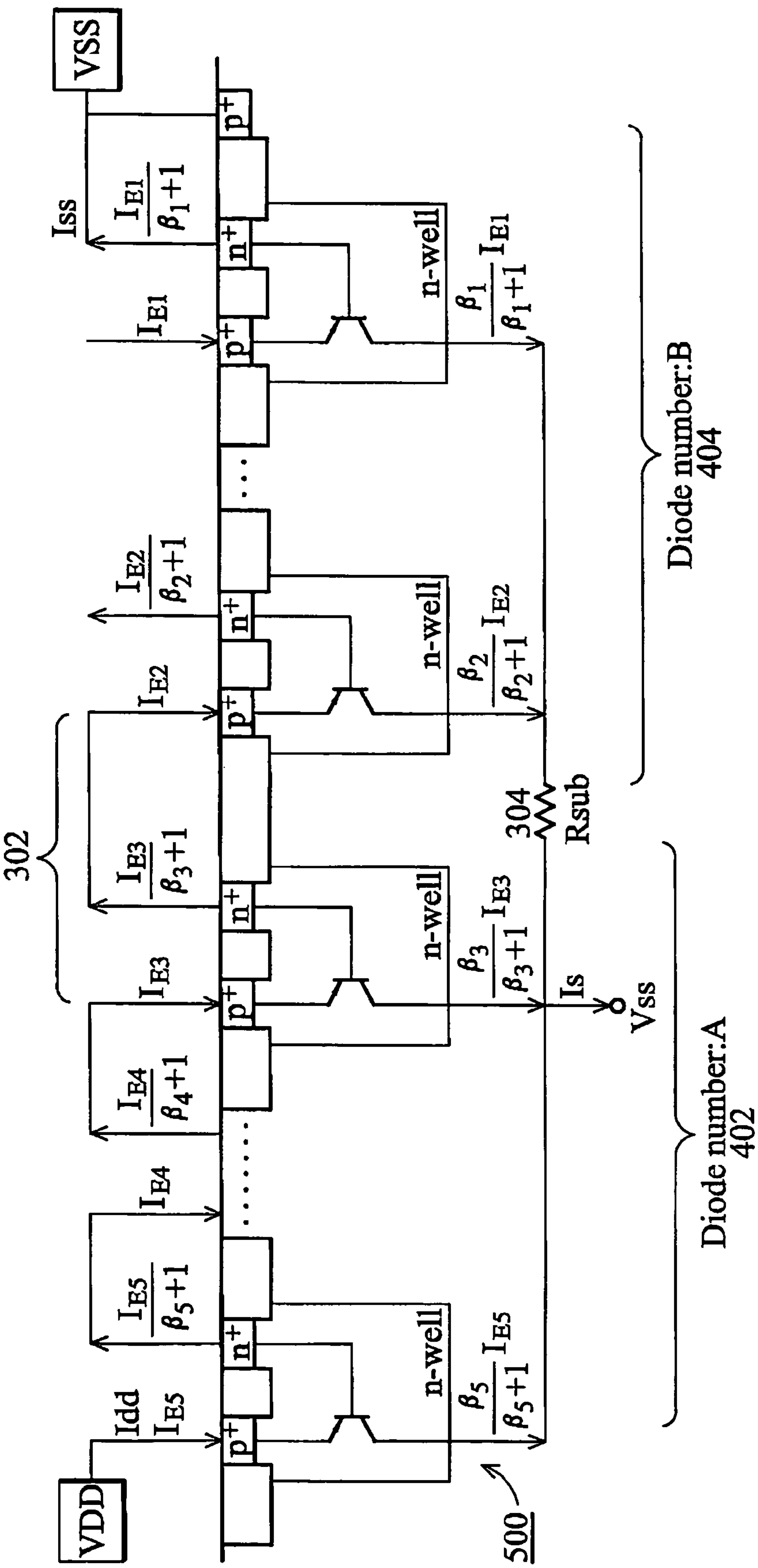
FIG. 5 illustrates a generalized model of the above-mentioned embodiments in which a general number of diodes in a first group are separated from a generalized number of diodes in the second group such that the first group and the second group are separated by sufficient physical space.

FIG. 5 generalizes the principle illustrated in FIG. 4, showing that the diodes can generally be divided into Diode Group A 402 and Diode Group B 404, wherein Diode Group A may have a number of diodes and Diode Group B may have a number of other diodes. In any case, the spacing 302 causing the $R_{sub}$ 304 between the active areas 210, thereby electrically isolate the two diode groups 402, 404. The effect of the isolation, as before, will be to allow for increased turn-on voltage and reduced leakage currents.

Table 1 below provides a generalized calculation of the diode string turn-on voltages based on the generalized grouping of serial diodes into two separate groups.

TABLE 1

| Diode Group Voltages | | | | | | | |
|---|---|---|---|---|---|---|---|
| Diodes in | Diodes in | Voltage measured at 1 uA | | Voltage measured at 10 uA | | Voltage measured at 100 uA | |
| first group | second group | Voltage V | Actual uA | Voltage V | Actual uA | Voltage V | Actual uA |
| 1 | 0 | 0.65 | 1.13 | 0.71 | 11.7 | 0.77 | 100 |
| 1 | 3 | 1.09 | 1.01 | 1.40 | 10.5 | 1.55 | 100 |
| 1 | 5 | 1.13 | 1.01 | 1.43 | 10.8 | 1.58 | 100 |
| 3 | 0 | 0.73 | 1.21 | 0.77 | 12.3 | 0.83 | 100 |
| 3 | 1 | 2.21 | 1.01 | 2.54 | 10.3 | 2.87 | 100 |
| 3 | 5 | 2.25 | 1.01 | 2.59 | 10.1 | 2.92 | 100 |
| 5 | 0 | 1.26 | 1.03 | 1.41 | 10.3 | 1.45 | 100 |
| 5 | 1 | 3.23 | 1.03 | 3.68 | 10.2 | 4.15 | 100 |
| 5 | 3 | 3.22 | 1.16 | 3.66 | 10.8 | 4.11 | 100 |

The first group of diodes defines the greatest marginal turn-on voltage whereas the second group will contribute a smaller marginal increase to the turn-on voltage. Using the first group as the primary contributor to defining turn-on voltage, an equation can be determined;

Where $V_d$ is the voltage drop across a single diode;

X is the number of diodes in the first group;

$V_{turn\text{-}on}$ is the turn-on voltage for the complete diode circuit.

The turn-on voltage can be approximated by the formula in Equation 2 below $$V_{turn\text{-}on}=(X+1)*V_d \quad \text{Equation 2}$$

In the chip design process, a number of diode groups can be defined where each group is represented a fixed number of PN-junctions. The groups can be placed in a circuit between power supplies having two groups separated by a resistive substrate to realize the benefits of the described embodiments. A simple formula is used to determine the correct turn-on voltage of the diode groups. Advantages of this structure may be further realized without additional process masks being used.

Figure 6:
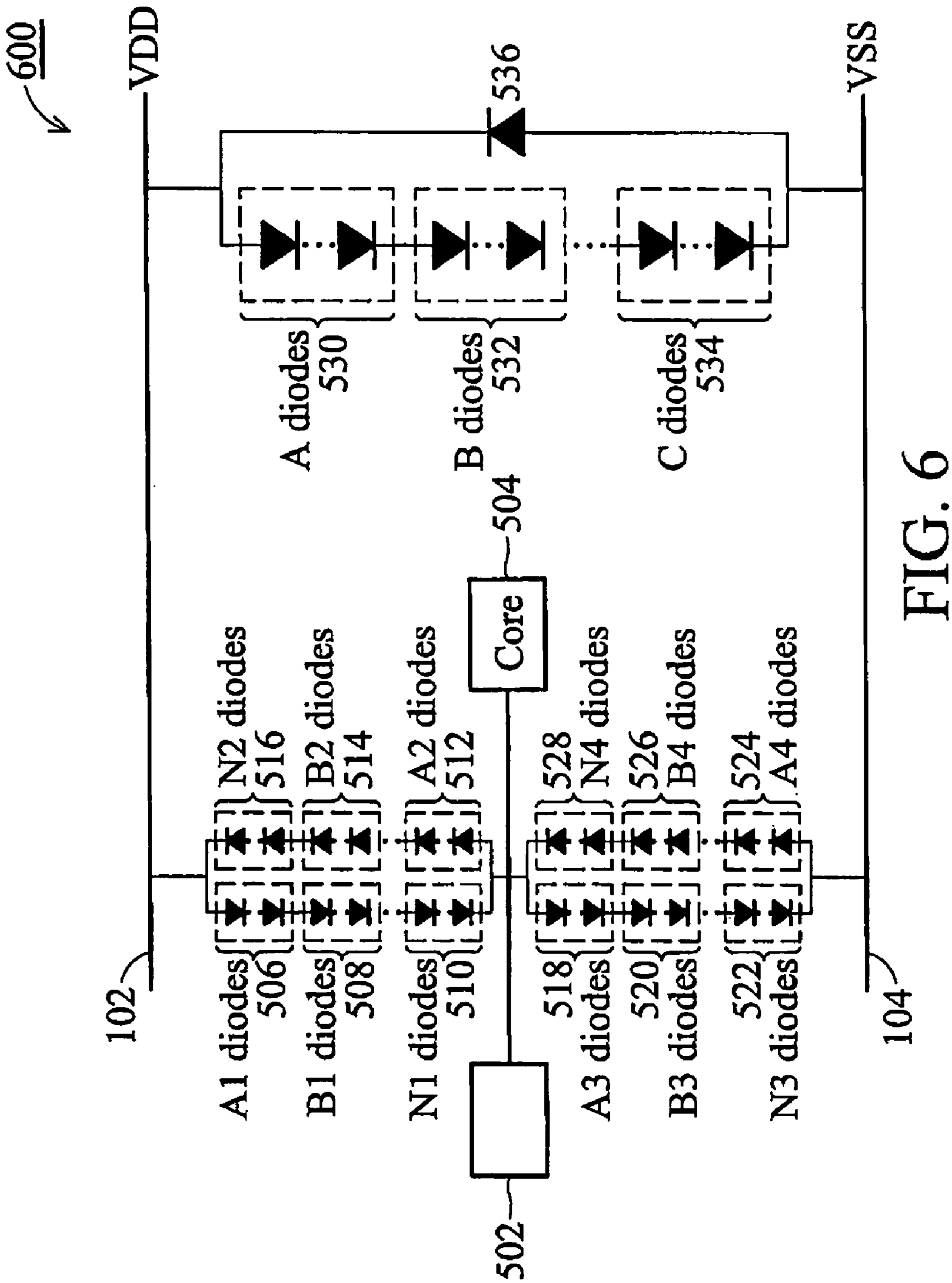
FIG. 6 illustrates an entire-system ESD design in which the power supply rails and the integrated circuit input/outputs are protected from ESD events.

FIG. 6 provides an illustration of a possible circuit for protection of both supply lines 102, 104 and integrated circuit input/outputs 502. In this embodiment, the I/O is protected by the diode string 506, 508, 510 such that if the input voltage drops too far beneath the VDD supply line 102 and the voltage difference between the input and the supply line accordingly exceeds the turn-on voltage for the string of diodes 506, 508, 510, these diodes will conduct and shunt away the current to the internal circuitry.

Diodes 512, 514, 516 similarly protect the I/O 502 from exceeding the VDD supply line by an unacceptable amount. And, in turn, diode string 518, 520, 522 protects the circuitry from the situation where the I/O line 502 exceeded the VSS rail by more than a certain amount. Diode string 524, 526 and 528 protects against the I/O line being negative beneath the VSS supply rail 104 by a certain amount. These diode strings all serve to protect the I/O line 502 and more specifically to protect the core circuitry 504 that is connected to the I/O line 502. Finally diode string 530, 532, 534 protects the supply rails relative to each other to ensure that the VDD supply rail 102 does not exceed the VSS supply rail 104 by more than a certain amount, and the diode 536 is provided to address the situation of the VSS supply rail becoming positive relative to the VDD supply rail 102.

Each diode string illustrated in FIG. 6 is shown as having an "A" group, a "B" group, and additional groups up to an "N" group. As described above, within each of these diode groups there can be provided one or more a substrate separations between electrically adjacent diodes in order to increase the turn-on voltage and decrease leakage current.

Several embodiments have been described in detail hereinabove. It is to be understood that the scope of the invention also comprehends embodiments different from those described, yet within the scope of the claims. For example, the terms "microcontroller," "controller," "processing circuitry," and "control circuitry" comprehend ASICs (Application Specific Integrated Circuits), PAL (Programmable Array Logic), PLAs (Programmable Logic Arrays), PLDs (Programmable Logic Devices), decoders, memories, non-software based processors, or other circuitry, or digital computers, including microprocessors and microcomputers of any architecture, or combinations thereof. Memory devices include SRAM (static random access memory), DRAM (dynamic random access memory), pseudo-static RAM, latches, EEPROM (electrically-erasable programmable read-only memory), EPROM (erasable programmable read-only memory), registers, or any other memory device known in the art. Words of inclusion are to be interpreted as non-exhaustive in considering the scope of the invention. It should be understood that various embodiments of the invention can employ or be embodied in hardware, software or microcoded firmware.

While this invention has been described with reference to illustrative embodiments, this description is not intended to be construed in a limiting sense. A few preferred embodiments have been described in detail herein. It is to be understood that the scope of the invention also comprehends embodiments different from those described, yet within the scope of the claims. Words of inclusion are to be interpreted as nonexhaustive in considering the scope of the invention. While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The section headings in this application are provided for consistency with the parts of an application suggested under 37 CFR 1.77 or otherwise to provide organizational cues. These headings shall not limit or characterize the invention (s) set out in any patent claims that may issue from this application. Specifically and by way of example, although the headings refer to a "Field of the Invention," the claims should not be limited by the language chosen under this heading to describe the so-called field of the invention. Further, a description of a technology in the "Description of Related Art" is not be construed as an admission that technology is prior art to the present application. Neither is the "Summary of the Invention" to be considered as a characterization of the invention(s) set forth in the claims to this application. Further, the reference in these headings to "Invention" in the singular should not be used to argue that there is a single point of novelty claimed in this application. Multiple inventions may be set forth according to the limitations of the multiple claims associated with this patent specification, and the claims accordingly define the invention(s) that are protected thereby. In all instances, the scope of the claims shall be considered on their merits in light of the specification but should not be constrained by the headings included in this application.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations, and data stores are illustrated in the context of specific configurations. Other allocations of functionality are envisioned and will fall within the scope of claims that follow. Finally, structures and functionality presented as discrete components in the exemplary configurations may be implemented as a combined structure or component. These and other variations, modifications, additions, and improvements may fall within the scope of the invention as defined in the claims that follow.

What is claimed is:

1. A series-diode circuit formed in an integrated circuit, comprising:

a) a first diode having first and second terminals and formed in a first active region of a semiconductor substrate;

b) a second diode having first and second terminals and formed in a second active region of the semiconductor substrate;

c) a third diode having first and second terminals and formed in a third active region of the semiconductor substrate;

d) a first electrical connection that electrically connects the second terminal of the first diode to the first terminal of the second diode; and e) a second electrical connection that electrically connects the second terminal of the second diode to the first terminal of the third diode;

f) wherein the third active region comprising the third diode is physically separated from the first and second active regions sufficiently far to interpose substantial electrical resistance between the third active region and the first and second active regions.

2. A series-diode circuit according to claim 1, wherein the third diode is spaced at least approximately 3 microns from nearest of the first and second diodes, and whereby this device spacing permits the sufficient separation of the third active region from the first and second active regions.

3. A series-diode circuit according to claim 1, wherein the first terminal of the first diode is connected to a power supply line within the integrated circuit.

4. A series-diode circuit according to claim 3, wherein the second terminal of the third diode is connected to another power supply line within the integrated circuit.

5. A series-diode circuit according to claim 3, wherein the second terminal of the third diode is connected to a signal line of the integrated circuit.

6. A series-diode circuit according to claim 1 and further comprising a fourth diode having first and second terminals and formed in a fourth active region of a semiconductor substrate, the second terminal of the fourth diode being electrically connected to the first terminal of the first diode and the fourth active region being formed sufficiently far from the first active region to interpose substantial electrical resistance between the fourth active region and the first active region.

7. A series-diode circuit according to claim 1 and further comprising a fourth diode having first and second terminals and formed in a fourth active region of a semiconductor substrate, the first terminal of the fourth diode being electrically connected to the second terminal of the third diode and the fourth active region being formed sufficiently far from the third active region to interpose substantial electrical resistance between the fourth active region and the first active region.

8. A series diode circuit according to claim 1 wherein at least one of the first, second and third diodes is a transistor diode formed in its respective active area.

9. A series diode circuit according to claim 1 wherein the at least one transistor diode is a pnp-transistor formed in an n-well within a p-substrate and having its collector formed by the pn-junction between the n-well and the p-substrate.

10. A series diode circuit according to claim 9 wherein the substantial resistance is created by the distance of p-substrate separating the n-well and remaining n-well active areas of the circuit.

11. An semiconductor device protection circuit comprising:

a) a first input;

b) a second input;

c) a first pnp-transistor diode formed in a first n-well on a p-substrate, the first transistor diode having a first, emitter terminal formed at a p-type area electrically connected to the first input, a base formed by the first n-well adjacent to the p-type area, and a collector formed by the p-substrate adjacent to the first n-well, wherein the base is a second terminal;

d) a second pnp-transistor diode formed in a second n-well on the p-substrate, the second transistor diode having an first, emitter terminal formed at a p-type area electrically connected to the second terminal of the first transistor diode, a base formed by the second n-well adjacent to the p-type area, and a collector formed by the p-substrate adjacent to the second n-well, wherein the base is a second terminal;

e) a third pnp-transistor diode formed in a third n-well on the p-substrate, the third transistor diode having an first, emitter terminal formed at a p-type area electrically connected to the second terminal of the second transistor diode, a base formed by the third n-well adjacent to the p-type area, and a collector formed by the p-substrate adjacent to the third n-well, wherein the base is a second terminal and is connected to the second input and f) wherein the third n-well is physically separated from the first and second n-wells sufficiently far enough to interpose substantial electrical resistance between the third n-well and the first and second n-wells such that leakage current through the combination of the first, second, and third pnp-transistor diodes is substantially reduced.

12. A semiconductor device protection circuit according to claim 11 and further comprising a fourth pnp-transistor diode formed in a fourth n-well on the p-substrate interposed between the second and third pnp-transistor diodes, the fourth transistor diode having a first, emitter terminal formed at a p-type area electrically connected to the second terminal of the second transistor diode, a base formed by the fourth n-well adjacent to the p-type area, and a collector formed by the p-substrate adjacent to the fourth n-well, wherein the base is a second terminal and is connected to the first terminal of the third transistor.

13. A semiconductor device protection circuit according to claim 12 wherein the fourth n-well is physically close to the third n-well and physically separated from the first and second n-wells such that the substantial electrical resistance is between the fourth n-well and the first and second n-wells and not between the third and fourth n-wells.

14. A semiconductor device protection circuit according to claim 12 wherein the fourth n-well is physically close to the first and second n-wells and physically separated from the third n-well such that the substantial electrical resistance is between the third n-well and the first, second and fourth n-wells.

15. A semiconductor device protection circuit according to claim 12 wherein the fourth n-well is physically separated from the first and second n-wells and from the third n-well such that substantial electrical resistance is interposed between the fourth n-well and the first and second n-wells and between the fourth n-well and the third n-well.

* * * * *